(12) United States Patent
Sharma et al.

(10) Patent No.: US 6,989,327 B2
(45) Date of Patent: Jan. 24, 2006

(54) FORMING A CONTACT IN A THIN-FILM DEVICE

(75) Inventors: Manish Sharma, Mountain View, CA (US); Thomas C. Anthony, Sunnyvale, CA (US); Heon Lee, Pohang-Si (KR)

(73) Assignee: Hewlett-Packard Development Company, L.P., Houston, TX (US)

( * ) Notice: Subject to any disclaimer, the term of this patent is extended or adjusted under 35 U.S.C. 154(b) by 85 days.

(21) Appl. No.: 10/770,083

(22) Filed: Jan. 31, 2004

(65) Prior Publication Data

US 2005/0170628 A1 Aug. 4, 2005

(51) Int. Cl.
*H01L 21/44* (2006.01)
(52) U.S. Cl. .............. 438/670; 438/668; 438/951; 438/FOR 343; 257/E21.508
(58) Field of Classification Search .............. 438/668, 438/670, 951, FOR 343; 257/E21.508
See application file for complete search history.

(56) References Cited

U.S. PATENT DOCUMENTS

| | | | | |
|---|---|---|---|---|
| 4,373,018 A | * | 2/1983 | Reichmanis et al. ........ 430/312 |
| 5,658,469 A | * | 8/1997 | Jennison .................. 428/611 |
| 5,705,432 A | * | 1/1998 | Lee et al. ................. 438/606 |
| 6,002,575 A | | 12/1999 | Kotecki et al. |
| 6,933,099 B2 | * | 8/2005 | O'Sullivan et al. ......... 430/313 |
| 2004/0020047 A1 | * | 2/2004 | Nishikawa et al. ........... 29/852 |
| 2004/0227614 A1 | * | 11/2004 | Kwok et al. ................ 338/308 |
| 2004/0251524 A1 | * | 12/2004 | Snyder et al. ............. 257/678 |

OTHER PUBLICATIONS

"Schottky Barrier Diod Process", IBM Technical Disclosure Bulletin, Oct. 1979, US, vol. 22, pp1872-1873.*
RD337036A, Apr. 1992, Anonymous.*
RD288056A, Apr. 1988, Anonymous.*

* cited by examiner

*Primary Examiner*—George Fourson
*Assistant Examiner*—Thanh V. Pham

(57) ABSTRACT

An aspect of the present invention is a method of forming a contact in a thin-film device. The method includes forming a liftoff stencil, depositing at least one material through the liftoff stencil, removing a portion of the liftoff stencil, forming a re-entrant profile with the remaining portion of the liftoff stencil and depositing a conductor material in contact with the at least one material on the re-entrant profile.

21 Claims, 8 Drawing Sheets

US 6,989,327 B2

FORMING A CONTACT IN A THIN-FILM DEVICE

FIELD OF THE INVENTION

The present invention relates generally to thin-film devices and more particularly to a method and system for forming a contact in a thin-film device.

BACKGROUND OF THE INVENTION

Rapid growth of information communicating apparatuses, such as a PDA (Personal Digital Assistant), demands higher integration, faster speed, and lower power consumption for memory elements and logic elements available for constituting these communicating apparatuses. In particular, realization of higher density and greater capacity of non-volatile memories has become a more important issue for the art of replacing such a hard disk or an optical disk which is difficult to be down-sized due to presence of moving elements.

Current non-volatile memories include flash memory, which is based on semiconductor technology and FRAM (Ferro-electric Random Access Memory), which is based on a ferro-dielectric technology. Nevertheless, flash memory is problematic in the sense that the writing speed remains on the order of micro-seconds and the re-write cycles are limited. FRAM is problematic in the sense that it is difficult to scale to ultra-high density and the re-writable cycles are insufficient.

A magnetic random access memory (MRAM), on the other hand, is a non-volatile memory that is free from the above-described problems. Due to improvement in physical characteristics of TMR (Tunnel Magneto-Resistive) materials in recent years, MRAM has drawn much attention in this field.

Because of its simple constitution, MRAM can readily be formed into highly integrated configurations. Inasmuch as MRAM executes a write operation by rotation of a magnetic moment, it is possible to secure sufficient re-writable cycles. Further, it is expected that the MRAM can execute accessing operations at an extremely high-speed (e.g. on the order of nano-seconds).

Conventional MRAM manufacturing methods typically do not utilize a lift-off technique. However, this technique is used in manufacture of abutted-junction magnetoresistive recording heads for hard disk drives. Using photo-resist for a mask material in forming elements, this method uses a single masking step to pattern one material by an etching process and a second material by a subsequent deposition and lift-off process. The resulting structure has a region of contact between the etched and lifted films defined by the boundary of the photoresist mask.

This implementation creates a contact region between two films in the same plane. However, for many device applications it is desired to produce a contact region between films on different planes. In particular, it is desirable that the contact does not introduce an electrical short circuit across the device being contacted.

Accordingly, what is needed is method and system for forming a contact in a thin-film device that is capable of minimizes the potential shorting of the device. The method and system should be simple, inexpensive and capable of being easily adapted to existing technology. The present invention addresses this need.

SUMMARY OF THE INVENTION

An aspect of the present invention is a method of forming a contact in a thin-film device. The method includes forming a liftoff stencil, depositing at least one material through the liftoff stencil, removing a portion of the liftoff stencil, forming a re-entrant profile with the remaining portion of the liftoff stencil and depositing a conductor material in contact with the at least one material on the re-entrant profile.

Other aspects and advantages of the present invention will become apparent from the following detailed description, taken in conjunction with the accompanying drawings, illustrating by way of example the principles of the invention.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION

Figure 1:
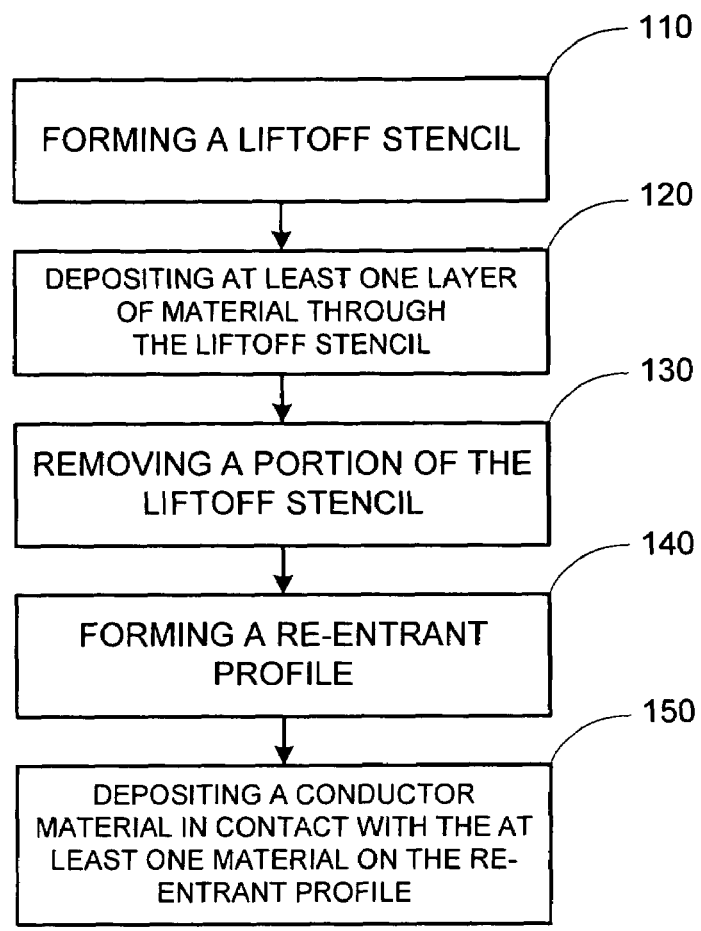
FIG. 1 is a high-level flow chart of a method in accordance with an embodiment of the present invention.

The present invention relates to a method and system for forming a contact in a thin-film device. The following description is presented to enable one of ordinary skill in the art to make and use the invention and is provided in the context of a patent application and its requirements. Various modifications to the embodiments and the generic principles and features described herein will be readily apparent to those skilled in the art. Thus, the present invention is not intended to be limited to the embodiment shown but is to be accorded the widest scope consistent with the principles and features described herein.

As shown in the drawings for purposes of illustration, a method and system for forming a contact in a thin-film device is disclosed. In accordance with an embodiment, a re-entrant profile is implemented in conjunction with the utilization of a lift-off stencil. By implementing a re-entrant profile in conjunction with the utilization of a lift-off stencil, materials are deposited in a more controlled fashion thereby minimizing the potential shorting of the device.

FIG. 1 is a high level flow chart of a method for forming a contact in a thin-film device. A first step 110 includes forming a liftoff stencil. A second step 120 includes depositing at least one material through the liftoff stencil. A third step 130 includes removing a portion of the liftoff stencil. A fourth step 140 involves forming a re-entrant profile with the remaining portion of the liftoff stencil. A final step 150 includes depositing a conductor material in contact with the at least one material on the re-entrant profile.

Figure 2A:
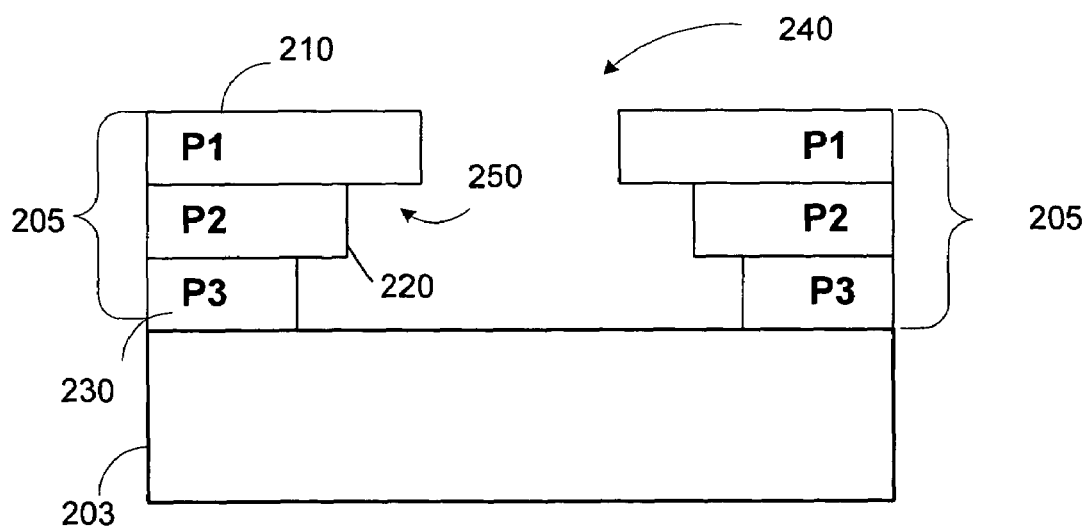
FIG. 2A shows a structure whereby three different layers of material are employed to create a liftoff stencil in accordance with an embodiment of the present invention.

In an embodiment, step 110 is accomplished with three different layers of material. FIG. 2A shows a structure whereby three different layers of material are employed to create a liftoff stencil. As can be seen in FIG. 2A, the liftoff stencil 205 is on a substrate 203 and includes a first layer 210, a second layer 220 and a third layer 230. The distance that the first layer 210 extends past the second layer 220 is defined as an undercut 250. Similarly, the geometries of the first layer 210 determine the size of opening 240 and the second layer 220 facilitates the lift-off process. Although the second layer 220 is included in the described embodiment, the second layer can be omitted and the third layer 230 can serve as an interlayer dielectric.

The first, second and third layers 210, 220, 230 of material can be a variety of different materials. For example, in an embodiment; the first, second and third layers 210, 220, 230 of material are photo-resist materials whereby each layer of photo-resist material is capable of being etched in a selective fashion. It should be understood that one of ordinary skill in the art will readily recognize that a variety of photo-resist materials can be implemented.

Additionally, although the liftoff stencil 205 is described as being formed from photo-resist material, one of ordinary skill will readily recognize that the liftoff stencil 205 can be formed with a variety of different materials. For example, at least one of the layers 210, 220, 230 can be a dielectric material such as a spin-on glass (SOG) material, $SiO_2$, $Si_3N_4$, $Al_2O_3$ or any of a variety of dielectric materials.

In an embodiment, step 120 is accomplished by utilizing deposition techniques to deposit at least one material through the opening 240. In an MRAM device for example, this step involves the deposition of requisite materials for forming a magnetic memory element. A magnetic memory element is an element having a resistance that is dependent upon the magnetic state thereof. Examples of such elements include magnetic tunnel junctions (MJTs) and giant magnetoresistance ("GMR") spin valves. Such elements include two ferromagnetic films (e.g. NiFe or CoFe) with a non-magnetic spacer between them. In the case of an MTJ memory element, the spacer is an insulator (for example $Al_2O_3$) whereas for a GMR memory element the spacer is a conductor (for example, Cu).

Although the embodiment is described in conjunction with the formation of an MRAM device, one of ordinary skill in the art will readily recognize that the described processes could be implemented in conjunction with the formation of a variety of different types of devices while remaining within the spirit and scope of the present invention.

Figure 2B:
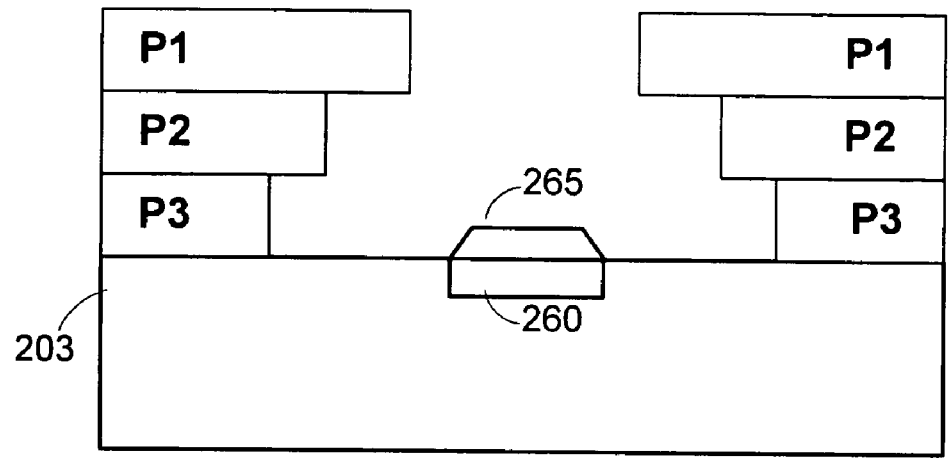
FIG. 2B shows the structure after the deposition of the TMR junction material in accordance with an embodiment of the present invention.

Step 120 is accordingly accomplished by first depositing a magnetic memory element material stack 265 through the opening 240 onto a previously patterned bottom conductor 260 wherein the bottom conductor 260 is a conductive material such as Cu, Au, Ag, Pt, Al, Ta or any combination thereof. Opening 240 defines the size and shape of the magnetic memory element 265. In an embodiment, the magnetic memory element 265 is an MTJ and is made up of an insulator layer sandwiched between two ferromagnetic layers. FIG. 2B shows the structure including the bottom conductor 260 and the magnetic memory element 265.

Figure 2C:
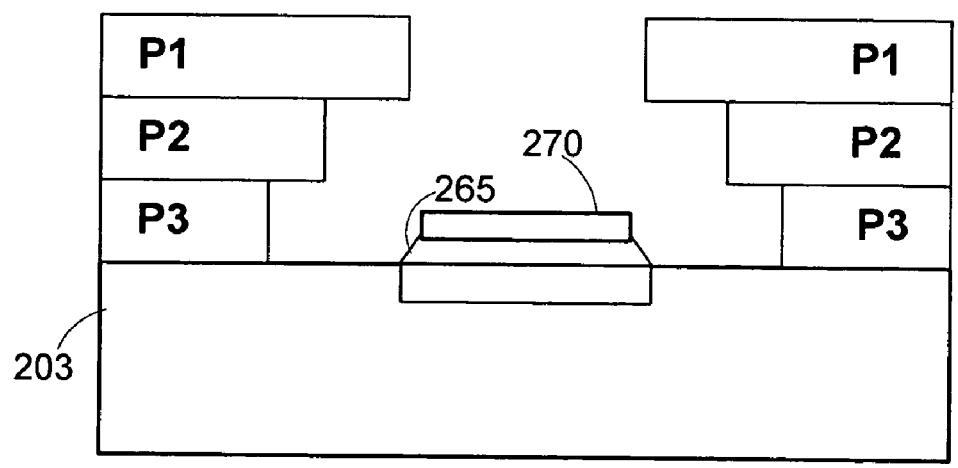
FIG. 2C shows the structure after the deposition of the hardmask layer in accordance with an embodiment of the present invention.

After depositing a magnetic memory element 265, an optional hardmask layer 270 is deposited in contact with the TMR junction 265. In varying embodiments, the hardmask layer 270 is a metal layer or other layers such as silicon oxide, silicon nitride, silicon carbide, tantalum nitride and tungsten nitride. FIG. 2C shows the structure after the deposition of the hardmask layer 270.

In an embodiment, the hardmask layer 270 is deposited by a collimated deposition method, such as thermal or electron beam evaporation or ion beam sputtering, to create a sharp edge profile in the hardmask layer 270 as depicted in FIG. 2C. Accordingly, hardmask layer 270 can be utilized to protect the magnetic memory element 265 in a subsequent etch step that can be introduced to better define the perimeter of the magnetic memory element 265.

Figure 2D:
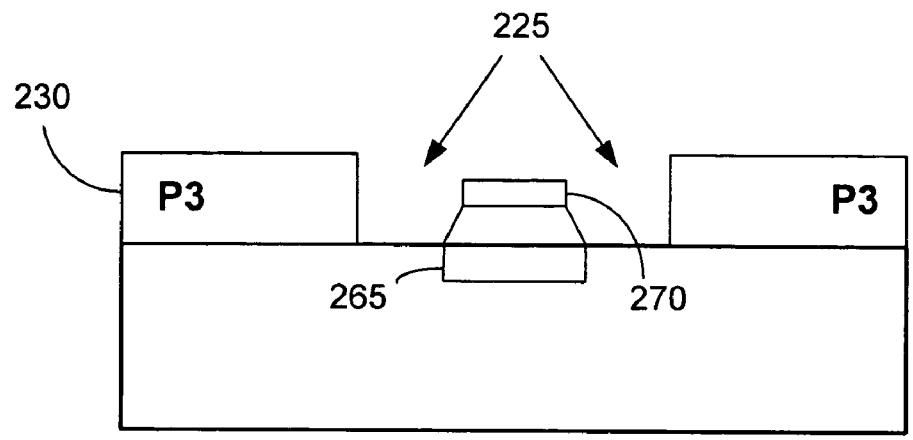
FIG. 2D shows the structure after the first and second photo-resists have been selectively removed in accordance with an embodiment of the present invention.

Referring back to FIG. 1, step 130 is accomplished by selectively removing the first photo-resist 210 and the second photo-resist 220 thereby leaving the third photo-resist 230. This is accomplished because the first and second photo-resists 210, 220 are capable of being selectively etched. FIG. 2D shows the structure after the first and second photo-resists 210, 220 have been selectively removed. As can be seen in FIG. 2D, there is a gap 225 between the third layer of material 230 and the hardmask layer 270. Additionally, the third layer of photo-resist 230 has a thickness greater than the combined thickness of the TMR junction material 265 and the hardmask layer 270.

Figure 2E:
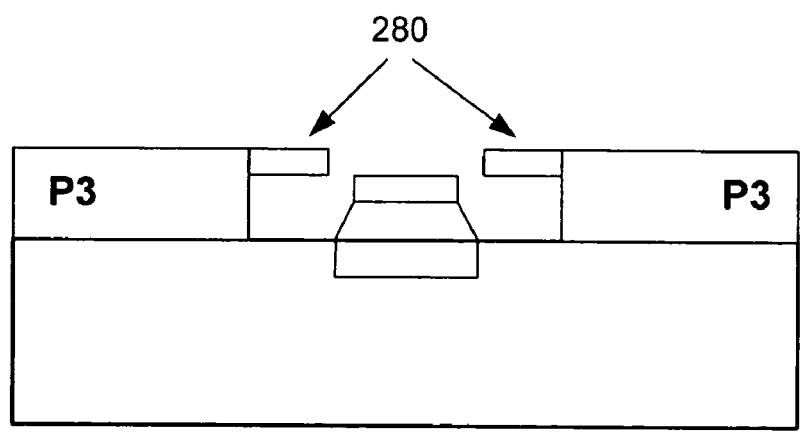
FIG. 2E shows the structure after the formation of a re-entrant profile in accordance with an embodiment of the present invention.
Figure 2F:
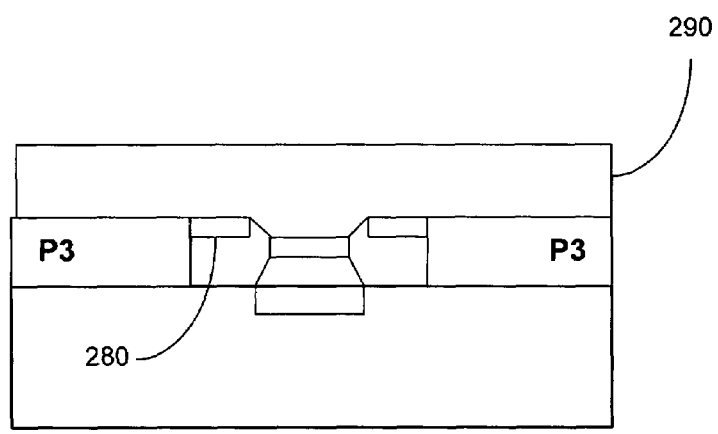
FIG. 2F shows the structure after the deposition of the top conductor in accordance with an embodiment of the present invention.

Step 140 involves forming a re-entrant profile. FIG. 2E shows the structure after the formation of a re-entrant profile 280. By implementing the re-entrant profile 280, subsequent materials are capable of being deposited in a more controlled fashion. This minimizes the potential occurrence of shorts in the resulting thin-film device.

The re-entrant profile 280 is formed utilizing one of a variety of different techniques. These techniques include, but are not limited to, soaking the third layer of material 230 in a chemical solution, annealing to initiate re-flow of material 230 and utilizing a dielectric layer in conjunction with a photo-resist layer to form the liftoff stencil.

Chemical Solution

In an embodiment, the third layer of material 230 is a photo-resist material capable of being soaked in a chemical solution thereby causing a top portion of the layer of photo-resist to swell and create the re-entrant profile 280. For example, if the third layer of material 230 is a photo-resist material from the AZ family of photo-resist materials, a chlorobenzene solution is capable of causing a top portion of the third layer of material 230 to swell and create the re-entrant profile 280.

Annealing

In another embodiment, an annealing process is used to create the re-entrant profile 280. Material 230 is annealed to initiate a shape change by a reflow process. During reflow the region of contact between material 230 and the substrate 203 remains fixed due to bonding between the two surfaces, however, the upper portion of the material is free to move. The cross-sectional profile of the annealed structure can be controlled by judicious choice of annealing conditions (time, temperature and ambient) and the physical properties (reflow temperature, viscocity and surface energy) and geometry (thickness and planar area) of material 230.

For example, material 230 can be an organic film, such as a photoresist. Annealing a patterned photoresist film above about 140 C causes the resist to reflow. If the thickness of the photoresist film is approximately equal to or greater than a planar dimension of the patterned film, then the reflowed film will assume a re-entrant profile as it flows to reduce its surface area. In such a case the profile will not be angular as shown in FIG. 2E, but instead will be a smooth contour. Polymer films other than photoresist and spin-on-glass (SOG) films may also used to produce a re-entrant profile by reflow.

Chemical Solution/Dielectric Layer

Figure 3A:
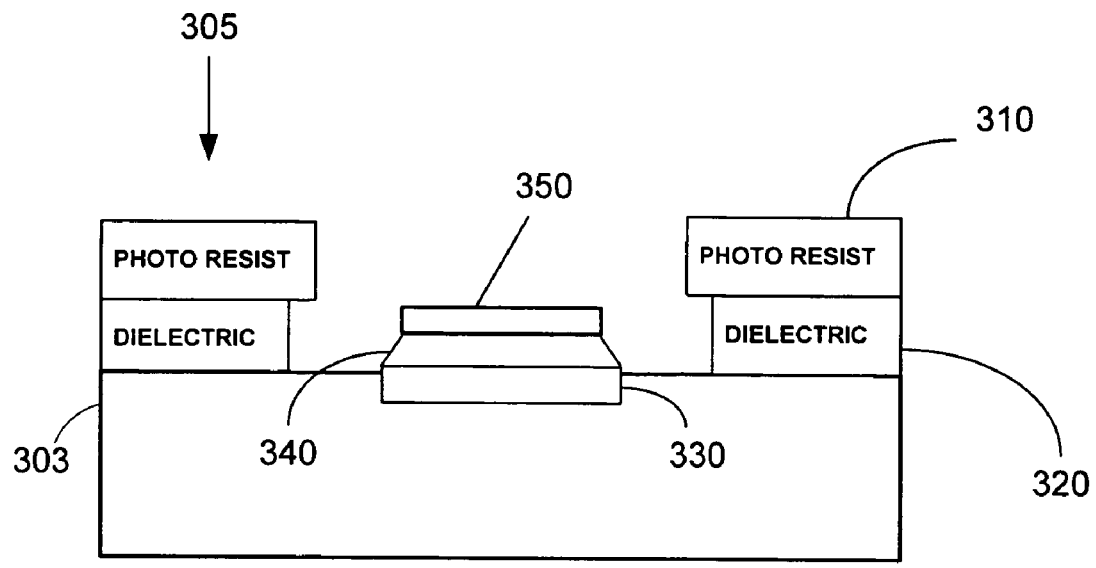
FIG. 3A shows a structure in accordance with an alternate embodiment of the present invention.

In an alternate embodiment, the liftoff stencil is formed on a substrate with a dielectric layer of material such as $SiO_2$ or $Si_3N_4$ and a photoresist layer. FIG. 3A shows a structure in accordance with the alternate embodiment. The structure includes a liftoff stencil 305 wherein the liftoff stencil 305 includes a photoresist layer 310 and a dielectric layer 320 on top of a substrate 303. The structure 300 also includes a bottom conductor 330, TMR junction material 340 and a hardmask layer 350. Hardmask layer 350 can be used to protect the underlying TMR junction materials 340 during an etching step that produces nominally vertical sidewalls in patterned TMR junction material 340.

Figure 3B:
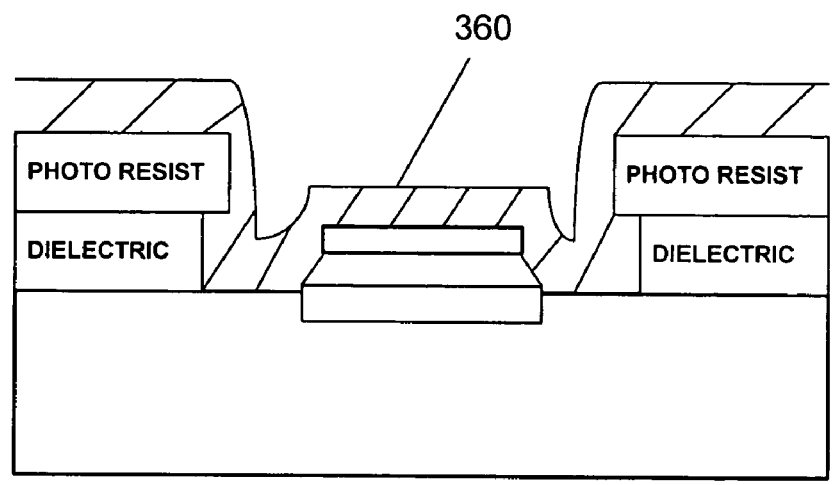
FIG. 3B shows the structure after the deposition of the conformal layer in accordance with the alternate embodiment of the present invention.

A conformal layer 360 is deposited over the structure as illustrated in FIG. 3B. Layer 360 can be either a metal or an insulator. Examples of insulators include $SiO_2$, $Al_2O_3$, $Si_3N_4$ and $Ta_2O_5$; metals include Al, Ta or Mg.

Figure 3C:
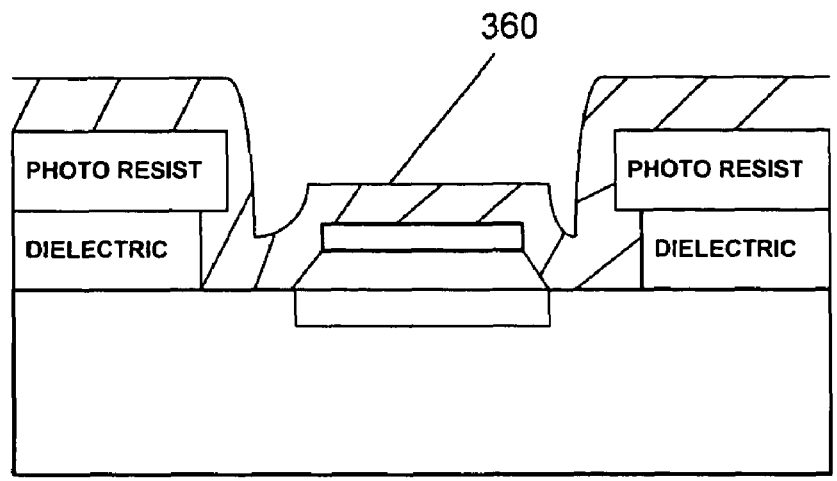
FIG. 3C shows a structure that includes the conformal layer in accordance with the alternate embodiment of the present invention.

If conformal layer 360 is a metal, the layer is then oxidized through the thickness of the film to create an insulating layer. For example, if layer 360 is Al, then the oxidation causes the formation of a layer of $Al_2O_3$; if layer 360 is Ta, the oxidation causes the formation of a layer of $Ta_2O_5$; and if layer 360 is Mg, the oxidation causes the formation of a layer of MgO. Additionally, if the layer of metal is Al, a nitridation process can be implemented to form a layer of AlN. FIG. 3C shows a structure that includes the conformal layer 360.

Figure 3D:
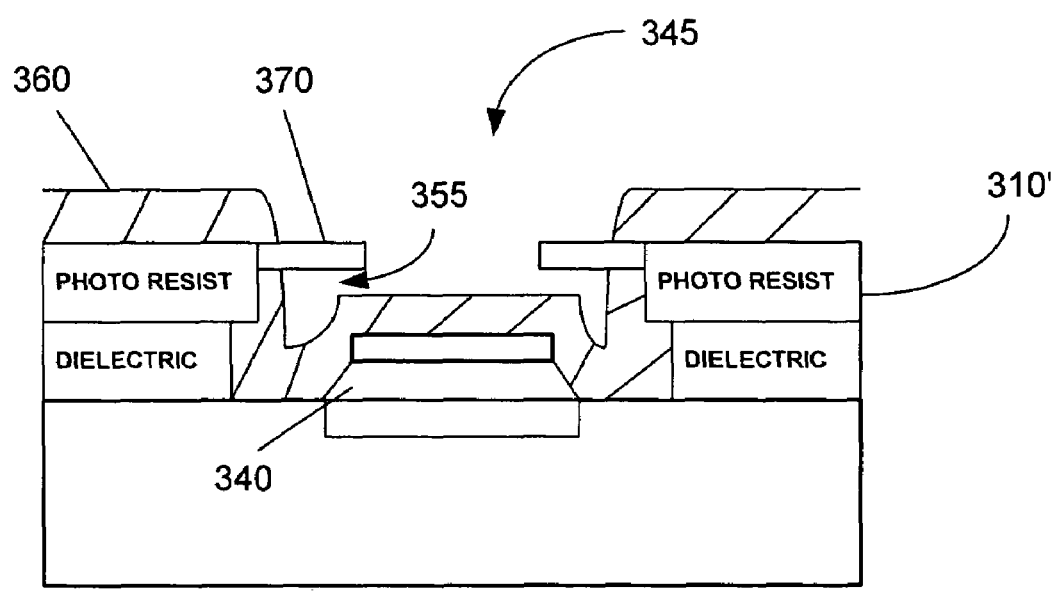
FIG. 3D shows the structure that includes the swelled photo-resist layer in accordance with the alternate embodiment of the present invention.

At this point in the process a re-entrant profile 370 is created in the photo-resist layer 310 by either exposing the structure to a chlorobenzene solution or annealing the structure to reflow the photo-resist layer 310. Chlorobenzene causes the photo-resist to swell, thereby expanding to create an undercut 355, whereas annealing causes the photo-resist 310 to reflow and assume a re-entrant profile. Either process reduces the size of the opening 345 and, if the photo-resist movement is sufficiently large, the re-entrant portion of the photo-resist can protect the insulator-coated sidewalls of the patterned TMR material 340. Chlorobenzene exposure or annealing also cracks the conformal layer 360 thereby facilitating an easier removal of the photo-resist layer 310 which occurs later in the process. FIG. 3D shows the structure that includes the re-entrant profile 370.

Figure 3E:
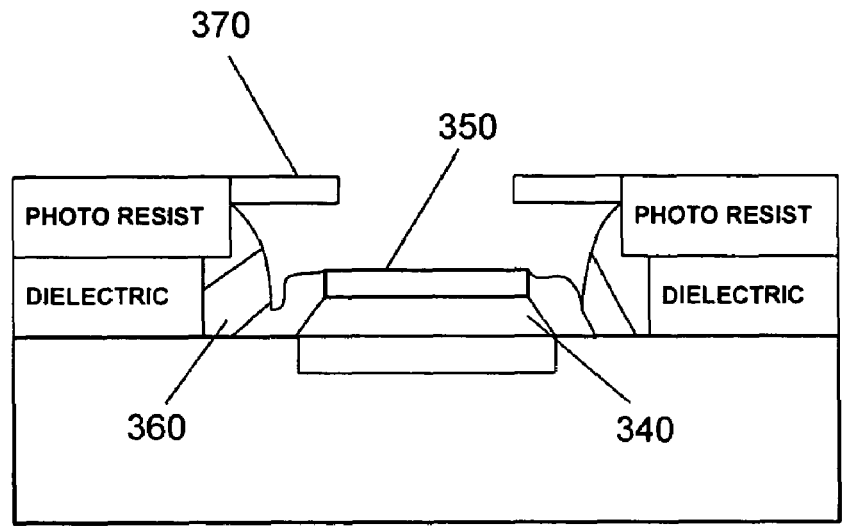
FIG. 3E shows the structure after the performance of the highly directional etch process wherein the hardmask layer is exposed in accordance with the alternate embodiment of the present invention.

A highly directional etch process such as ion-milling is then utilized to remove a portion of the conformal layer 360 thereby exposing the hardmask layer 350. The re-entrant profile 370 protects the sidewalls of the TMR material 340 from being etched. FIG. 3E shows the structure after the performance of the highly directional etch process wherein the hardmask layer 350 is exposed. Note that a portion of the conformal layer 360 remains on the sidewalls of TMR material 340.

Although the above described etch process is disclosed as an ion-milling process, one of ordinary skill in the art will readily recognize that a variety of different highly directional etch process can be utilized in conjunction with the embodiment while remaining within the spirit and scope of the present invention.

Figure 3F:
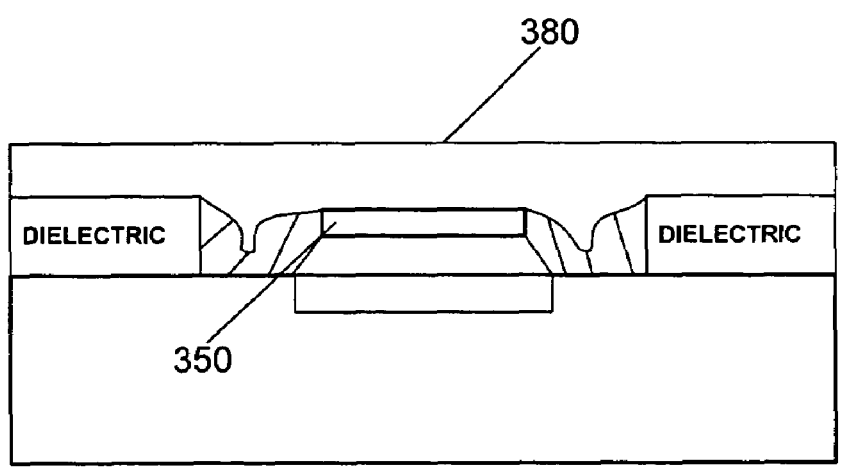
FIG. 3F shows the structure after the deposition of the top conductor in accordance with the alternate embodiment of the present invention.

Finally, the re-entrant profile 370 and the remaining portion of the photo-resist layer 310 is removed and a top conductor 380 is deposited in contact with the hardmask layer 350. In this embodiment the hardmask layer 350 is a conducting material. FIG. 3F shows the structure after the deposition of the top conductor 380.

Figure 4:
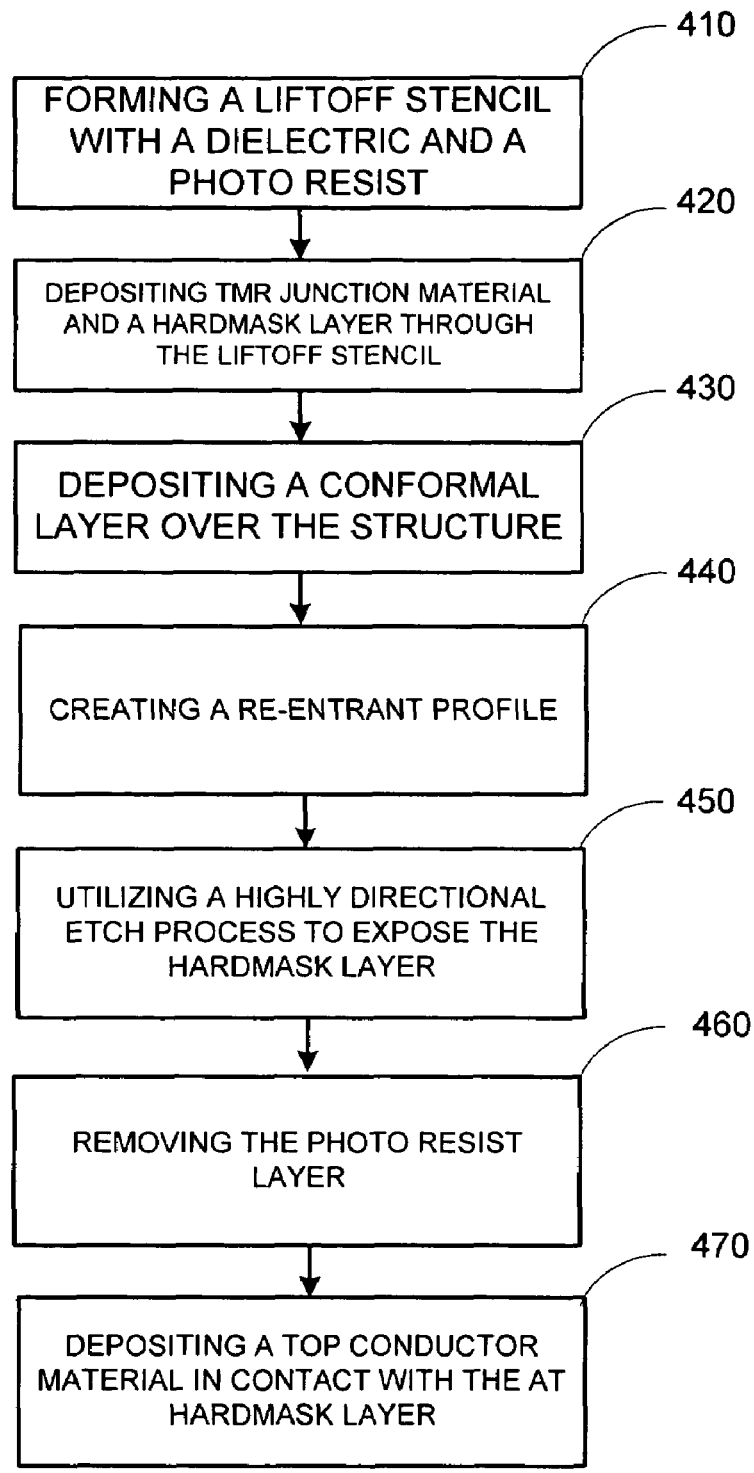
FIG. 4 shows a flowchart of a process in accordance with the alternate embodiment of the present invention.

FIG. 4 is a flow chart of process for forming a contact in a thin-film device in accordance with the alternate embodiment of the present invention. A first step 410 involves forming a liftoff stencil wherein the liftoff stencil includes a dielectric layer and a photo-resist layer. A second step 420 includes depositing TMR junction material and a hardmask layer through the liftoff stencil. A third step 430 includes depositing a conformal layer over the structure. In an embodiment, the conformal layer is an insulator such as $SiO_2$, $Al_2O_3$, $Si_3N_4$ or $Ta_2O_5$, or a metal such as Al, Ta or Mg. If the conformal layer is a metal, the conformal layer is then oxidized.

A fourth step 440 includes creating a re-entrant profile. In an embodiment, this step is accomplished by soaking the photo-resist layer in a chlorobenzene solution or subjecting the photo-resist layer to an anneal. A fifth step 450 includes utilizing a highly directional etch process to expose the hardmask layer. A sixth step 460 includes removing the layer of photo-resist. A final step 470 includes depositing a top conductor material in contact with the hardmask layer.

Although the above-described embodiments disclose a top and bottom conductor, one of ordinary skill in the art will readily recognize that the top and bottom conductors can be inter-changed while remaining within the spirit and scope of the present invention.

Various embodiments of the present invention disclose a method and system for forming a contact in a thin-film device. The present invention implements a re-entrant profile in conjunction with the utilization of a lift-off stencil. By implementing a re-entrant profile in conjunction with the utilization of a lift-off stencil, materials are deposited in a more controlled fashion thereby minimizing the potential shorting of the device.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method of forming a contact in a thin-film device comprising:
   forming a liftoff stencil;
   depositing at least one material through the liftoff stencil;
   removing a portion of the liftoff stencil;
   forming a re-entrant profile with the remaining portion of the liftoff stencil; and
   depositing a conductor material in contact with the at least one material on the re-entrant profile.

2. The method of claim 1 wherein the thin-film device is a magnetic random access memory device.

3. The method of claim 1 wherein forming the liftoff stencil further comprises:
   utilizing at least one layer of photo-resist to form the liftoff stencil wherein the liftoff stencil includes an undercut.

4. The method of claim 2 wherein forming a re-entrant profile further comprises:
   swelling a top portion of the at least one layer of photo-resist.

5. The method of claim 2 wherein depositing at least one material through the liftoff stencil further comprises:
   depositing TMR junction material in contact with a previously deposited bottom conductor material.

6. The method of claim 3 wherein the at least one layer of photo-resist further comprises a first layer of photo-resist and a second layer of photo-resist.

7. The method of claim 3 wherein forming the liftoff stencil further comprises:
   utilizing a dielectric material to form a portion of the liftoff stencil.

8. The method of claim 4 wherein swelling a top portion of the at least one layer of photo-resist further comprises:
   soaking the at least one layer of photo-resist in a chlorobenzene solution.

9. The method of claim 4 wherein swelling a top portion of the at least one layer of photo-resist further comprises:
   annealing the at least one layer of photo-resist at a temperature sufficient to reflow the at least one layer of photo-resist.

10. The method of claim 6 wherein removing a portion of the liftoff stencil further comprises removing the first and second layers of photo-resist.

11. The method of claim 7 wherein a thickness of the dielectric material is more than a thickness of the at least one material.

12. The method of claim 10 wherein the liftoff stencil comprises the at least one photo-resist material in contact with the dielectric material and forming a re-entrant profile further comprises:
   depositing a layer of material over the at least one photo-resist material wherein the layer of material comprises at least one of $SiO_2$, $Al_2O_3$, $Si_3N_4$ or $Ta_2O_5$;
   soaking the liftoff stencil in a chlorobenzene solution.

13. The method of claim 10 wherein the liftoff stencil comprises the at least one photo-resist material in contact with the dielectric material and forming a re-entrant profile further comprises:
   depositing a layer of metal over the at least one photo-resist material;
   oxidizing the metal layer; and
   soaking the liftoff stencil in a chlorobenzene solution.

14. The method of claim 13 wherein depositing a conductor material further comprises:
   utilizing a highly directional etch process to remove a portion of the oxidized metal layer;
   removing the at least one layer of photo-resist; and
   depositing a top conductor.

15. A method of forming a contact in a magnetic random access memory device comprising:
   forming a liftoff stencil with at least two layers of photo-resist wherein the liftoff stencil includes an undercut;
   depositing TMR junction material through the liftoff stencil in contact with a previously deposited bottom conductor;
   depositing a hardmask layer through the liftoff stencil and in contact with the TMR junction material;
   removing at least one of the at least two layers of photo-resist;
   forming a re-entrant profile with a remaining portion of the liftoff stencil; and
   depositing a top conductor material in contact with the hardmask layer on the re-entrant profile.

16. The method of claim 15 wherein forming a liftoff stencil further comprises:
   utilizing a dielectric material to form the liftoff stencil.

17. The method of claim 15 wherein forming a re-entrant profile with a portion of the liftoff stencil further comprises:
   swelling a top portion of one of the at least two layers of photo-resist.

18. The method of claim 16 wherein forming a re-entrant profile further comprises:
   depositing a layer of material over the at least one photo-resist material wherein the layer of material comprises at least one of $SiO_2$, $Al_2O_3$, $Si_3N_4$ or $Ta_2O_5$; and
   soaking the liftoff stencil in a chlorobenzene solution.

19. The method of claim 16 wherein the liftoff stencil comprises the at least one photo-resist material in contact with the dielectric material and forming a re-entrant profile further comprises:
   depositing a layer of metal over the at least one photo-resist material;
   oxidizing the metal layer; and
   soaking the liftoff stencil in a chlorobenzene solution.

20. The method of claim 17 wherein swelling the top portion of one of the at least two layers of photo-resist further comprises:
   soaking the one of the at least two layers of photo-resist in a chlorobenzene solution.

21. The method of 19 wherein depositing a conductor material further comprises:
   utilizing a highly directional etch process to remove a portion of the oxidized metal layer;
   removing the one of the at least two layers of photo-resist; and
   depositing a top conductor.

* * * * *